United States Patent [19]

Soth et al.

[11] Patent Number: 4,814,621

[45] Date of Patent: Mar. 21, 1989

[54] LEAD DETECTION BY VARIABLE PRESSURE LEAD-CONTACTING OPTICAL INTERPOSERS

[75] Inventors: Henry J. Soth, Brackney, Pa.; Christopher J. Scarinzi, Binghamton, N.Y.

[73] Assignee: Universal Instruments Corporation, Binghamton, N.Y.

[21] Appl. No.: 143,059

[22] Filed: Jan. 12, 1988

[51] Int. Cl.$^4$ ............................................. G01N 21/86
[52] U.S. Cl. ....................................... 250/561; 29/741
[58] Field of Search ................... 250/561, 222 R, 227; 29/712, 720, 739, 741, 566.1, 566.3, 705

[56] References Cited

U.S. PATENT DOCUMENTS 4,403,406  9/1983  Foley ..................................... 29/741
4,727,637  7/1988  Buckwitz et al. ...................... 29/739

Primary Examiner—David C. Nelms
Assistant Examiner—William L. Oen
Attorney, Agent, or Firm—Franklin D. Wolffe; Morris Fidelman

[57] ABSTRACT

Presence, absence, and adequacy of length of component leads are detectable by engaging each lead with a corresponding interposer and monitoring the amount of displacement of each interposer or plunger in response to the lead. Each plunger is provided with an optic fiber for guiding and directing a light beam from a transmitter to a receiver of a sensor when a lead is missing or too short. The lead engaging portion of the plunger is interchangeable to accommodate different lengths of leads and heights of cut and clinch anvils. For DIP components, each half of the inventive device receives all of the leads on one side of the component, with an individual piston for each lead. Thus, mirror image devices may be used for oppositely spaced rows of leads of a DIP, with the spacing between the mirrored halves of the device being adjustable according to the center-to-center (CTC) spacing between leads on opposite sides of the component body. Each plunger of one of the mirror halves is simultaneously engaged by a fluid common to the remaining pistons thereof for extension, as well as retraction, of the lead engaging portions.

14 Claims, 5 Drawing Sheets

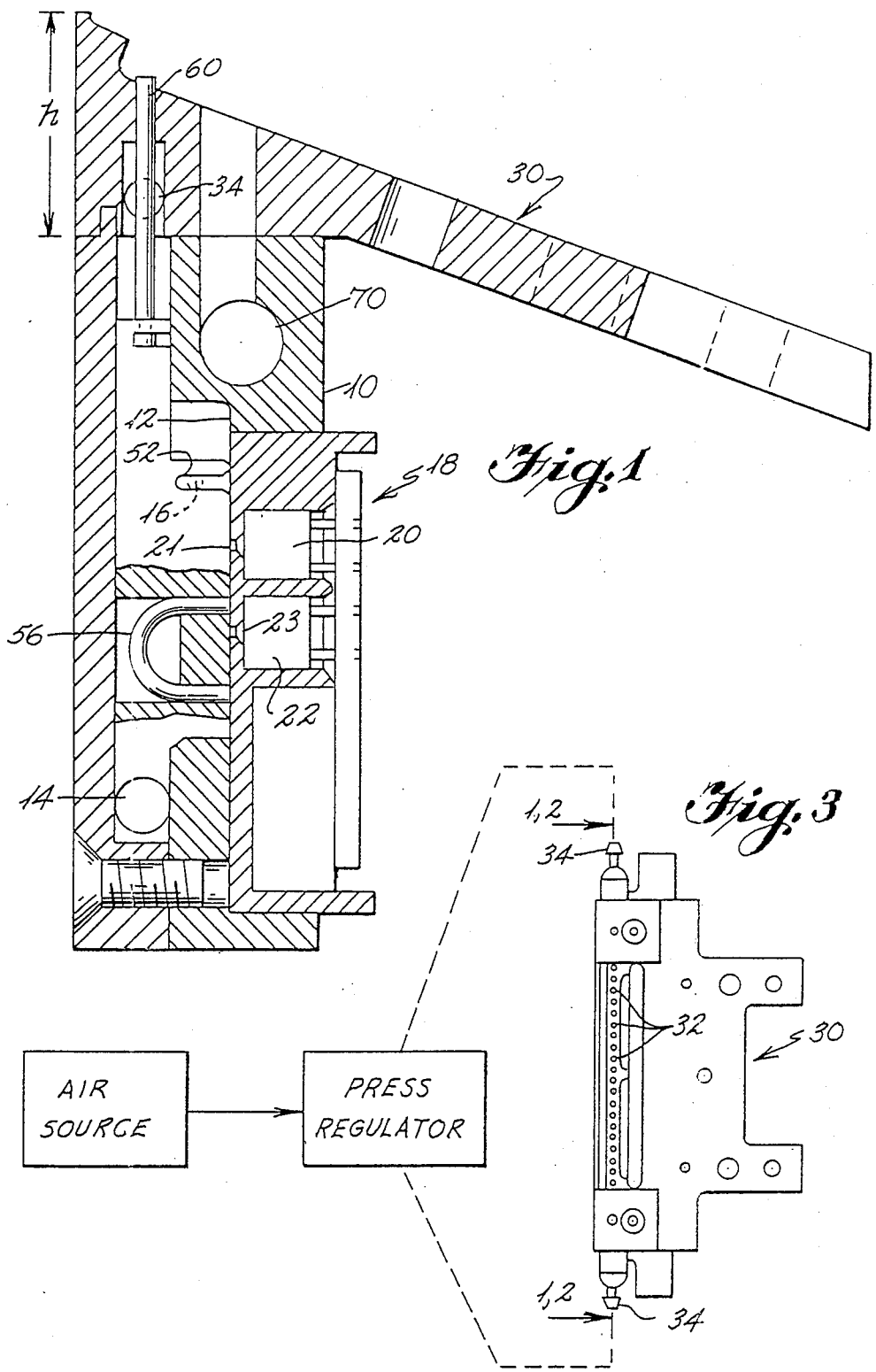

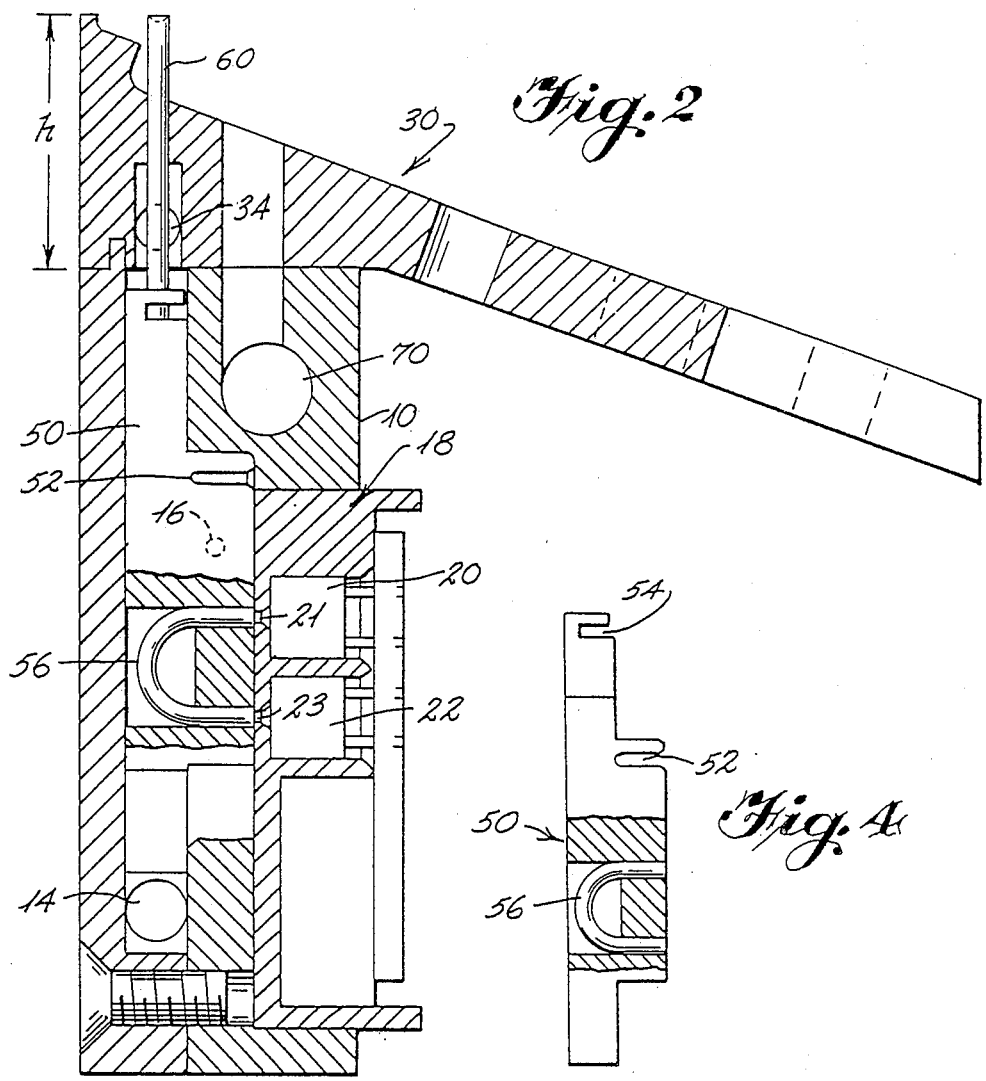

LEAD DETECTION BY VARIABLE PRESSURE LEAD-CONTACTING OPTICAL INTERPOSERS

PRIOR ART CROSS-REFERENCES

U.S. Pat. No. 4,621,419 AUTOMATIC I.C. MOUNTING PROCESS AND APPARATUS FOR PERFORMING THE PROCESS - issued Nov. 11, 1986 to Hino, et al.

U.S. Pat. No. 4,549,087 - LEAD SENSING SYSTEM - issued Oct. 22, 1985 to Duncen, et al.

U.S. Pat. No. 4,499,649 - ALL LEAD SENSER - issued Feb. 19, 1985 to Maxner.

U.S. Pat. No. 4,286,379 - APPARATUS FOR DETECTING LEADS - issued Sept. 1, 1981 to Kawa, et al.

U.S. Pat. No. 4,151,637 - DIP COMPONENT LEAD CUT AND CLINCH APPARATUS - issued May 1, 1979 to Zemek et al.

Japanese Patent Application No. 55-97542 - PARTS LEAD DETECTOR/BENDER - laid open Feb. 6, 1982.

Japanese Patent Application No. 56-136698 - ABNORMAL INSERTION DETECTING METHOD FOR I.C. INSERTING APPARATUS-laid open Mar. 5, 1983.

BACKGROUND OF THE INVENTION

The invention deals with a method and apparatus for detecting defective leads of a component which has been mounted on a circuit board prior to trimming the leads and/or bending (clinching) the leads to the underside of the circuit board, and particularly to detecting the leads of a multi-lead electronic component such as a dual in-line package (DIP).

DIP components comprise parallel rows of leads projecting from each side of the component, with anywhere from two to twenty one leads in each row. In high volume, mechanized population of circuit boards with electronic components, there exists the need for trimming excess portions of the leads which extend through the circuit board and bending or forming (clinching) the remaining portions of the leads to the underside of the circuit board prior to soldering, such as by-flow soldering. U.S. Pat. No. 4,151,637 is exemplary of a device for cutting and clinching inwardly or outwardly and for varying the machine according to the center distances of opposed leads; and the subject matter of this patent is incorporated herein by reference.

Defects such as missing or bent leads result in misinsertions. Upon insertion of the lead through a hole of the circuit board, it is also possible that an insufficient amount of the lead is presented for a subsequent soldering operation. Accordingly, the instant invention provides means for detecting such misinserted and defective leads prior to clinching and/or cutting thereof, such that a programmed controller for the overall operation may receive information regarding the defect and halt or change processing of the circuit board according to a particular program used.

Of the above-referenced prior art, only U.S. Pat. Nos. 4,499,649 and 4,549,087 disclose a method and means for cutting and clinching leads immediately after detecting the presence of all leads. However, lead presence is detected by reflection of light off of the lead directly, requiring that the light emitter and receiver be provided in a package which is disposed very close to the circuit board and thus is more likely damaged and/or dirtied by the dust and debris generally associated with lead cutting.

Japanese Patent Application No. 56-136698 discloses a device which also relies upon the direct presence or absence of a lead of a component, such that an acceptable lead must interrupt a light beam. The particular configuration of this device, along with the necessity for sensing the leads directly, does not provide easy adaptability of such a detection method or apparatus to a cut and/or clinch mechanism.

U.S. Pat. No. 4,286,379 provides a means for detecting whether or not all of the leads of the component have been inserted properly into a circuit board with the detection of properly inserted leads being performed during the forming or clinching of leads of the component to the underside of the circuit board. Plural pivotal forming or clinching levers, one for each lead, are provided with apertures through which light-emitting elements can communicate with light-receiving elements when all of the levers have been properly displaced by engagement with acceptable component leads. When a lead does not extend below the circuit board, displacement of the lever corresponding to that lead does not occur, and that lever will block light transmission and provide an indication of a defect. The complexity of the forming and detecting head of this device prevents, or at least limits, any provision for lead trimming. Furthermore, the spring means which biases each lever into the proper position prior to lead engagement presents an engineering design problem in that the leaf material of the springs must be very lightweight when used on soft leads in order to assure a positive displacement or deflection of the levers by the soft leads. Thus, without constant cleaning of the tooling assembly, any contamination built up therein could affect the springs and/or photosensors.

U.S. Pat. No. 4,621,419 discloses a lead detector in FIG. 4 in which there is a plunger provided for each lead that is inserted through a circuit board hole. An acceptable lead depresses a corresponding spring biased so that the lower portion of the plunger will block a slider from moving in a direction perpendicular to the direction of movement of the plunger and thus prevent interruption of a light beam by the slider. An unacceptable lead fails to depress the plunger sufficiently to block movement of the slide, resulting in an unobstructed light beam providing an indication of a defective lead. This device also is not disclosed as part of, nor is it readily adaptable to, a out and clinch device.

Japanese Patent Application No. 55-97542 discloses a lead detector and bender (clincher) for the leads of parts such as integrated circuits mounted on a circuit board. A vertically recriprocatable support member 2 has plungers 6, each of which is normally biased to an extended position of FIG. 1 by compression springs 5. Upon insertion of the leads of the component through the holes of the circuit board, support member 2 is raised to contact plunger 6 with the ends of the inserted leads and thus to depress the plunger 6 against the biasing of springs 5. As seen in FIG. 2 of this reference, an acceptable lead will allow a beam of light to pass between members 8 and 9 through a hole 7 of the plunger 6 to indicate acceptance of the lead. Of course, a defective lead would not depress the plunger sufficiently for the light beam to be made. Thereafter, member 2 is retracted so that the leads may be clinched upon extension of members 11.

The method and apparatus of this prior art reference has a significant defect in that an individual spring is used for each plunger. There is a strong possibility of interference between springs when dealing with DIPs which have upwards of 40 leads and center-to-center spacings of 0.100 inches so that the plungers must be arranged in sliding engagement side-by-side. Further, the device of this reference is only able to clinch inwardly, whereas the instant invention can clinch both inwardly and outwardly as well as provide the trimming function that the prior art reference can not provide. Also, by having the transmitter and receiver of each plunger spaced on opposite sides of the plunger, additional space is required for the block 2.

Thus, these prior art sensors can be categorized generally as utilizing: (i) a direct method of interrupting or reflecting at least one light beam by at least one lead, or (ii) an indirect method of sensing the leads by sensing the status of pins or levers which are interposed between the leads and light beams.

With the direct sensing method, the actual sensing is done in a contaminated area so that the sensors are subject to failure due to contamination. Typically, leads protruding beyond the bottom surface of the circuit board by less than 0.050 inches are insufficiently long to interrupt the light beams, whether or not they are sufficiently long for clinching and soldering.

In the indirect sensing devices, the interposers for contacting the leads are generally spring-biased and the spring forces are held to a minimum in order to keep from bending the leads. Thus the slightest contamination can cause failure of the springs. Still further, it is necessary to replace the springs in order to selectively vary the forces applied to the leads.

Accordingly, it is an object of the instant invention to obviate the contamination problems inherent in prior art direct and indirect sensors.

It is also an object of the invention to provide selective variation of the forces applied to the leads in order to perform such detection without requiring interchange of parts or disassembly of the device.

It is a further object of the invention to provide for adjustment of the device to various lead lengths and/or anvil heights.

Still further, it is an object of the invention to redirect and guide light via an interposer so as to allow the light transmitter and receiver to be positioned on the same side of a mirrored half of the device. Such an arrangement supports different variable spacing of the halves commensurate with the center distances between leads on opposite sides or ends of a component, while also facilitating inward and outward cut and clinch capabilities of the device.

These and other objects of the invention may be understood from the remaining disclosure.

BRIEF SUMMARY OF THE INVENTION

Presence, absence, and adequacy of length of component leads are detectable by engaging each lead with a corresponding interposer and monitoring the amount of displacement of each interposer or plunger in response to the lead. Each plunger is provided with an optic fiber for guiding and directing a light beam from a transmitter to a receiver of a sensor when a lead is missing or too short. The lead engaging portion of the plunger is interchangeable to accommodate different lengths of leads and heights of cut and clinch anvils. For DIP components, each half of the inventive device receives all of the leads on one side of the component, with an individual piston for each lead. Thus, mirror image devices may be used for oppositely spaced rows of leads of a DIP, with the spacing between the mirrored halves of the device being adjustable according to the center-to-center (CTC) spacing between leads on opposite sides of the component body. Each plunger of one of the mirror halves is simultaneously engaged by a fluid common to the remaining pistons thereof for extension, as well as retraction, of the lead engaging portions.

BRIEF DESCRIPTION OF THE DRAWINGS

FIGS. 1 and 2 are cross sections as generally indicated by arrows 1—1 and 2—2 of FIG. 3 with the pistons in the retracted and extended positions, respectively FIG. 3 is a top plan view of one-half of the device of the instant invention, but with the forming and cutting blades removed therefrom.

FIG. 4 is a front elevation, partially in cross section, of one of the interposers, but without the removable lead contacting pin.

FIG. 5 is a top plan view of the device of FIG. 4.

DETAILED DESCRIPTION OF THE INVENTION

FIGS. 1-3, 11 and 12 illustrate one-half of a cut and clinch device adapted to operate upon one lead of an axial lead component or one row of leads of a DIP component, but it should be understood that a mirror image of the illustrated device will operate on the other lead of an axial lead component or the other row of leads of a DIP component. Thus, the reader is requested to consider a mirror image of the device illustrated in these figures as operating on the other end or side of the component in the manner as related in the following discussion.

For purposes of this disclosure, an "acceptable lead" is one which protrudes from the hole of the circuit board by an amount sufficient for a function such as cutting a lead, clinching a lead to the underside of the circuit board, or both clinching and cutting functions to be performed, although it is conceivable that the case may arise where no cutting or clinching need be performed so that detection of sufficient extension of the lead from the underside of the circuit board is all that needs to be accomplished. An "unacceptable lead" includes a missing or bent lead or any other situation wherein the lead does not extend sufficiently below the circuit board for detection by the inventive device.

Figure 12:
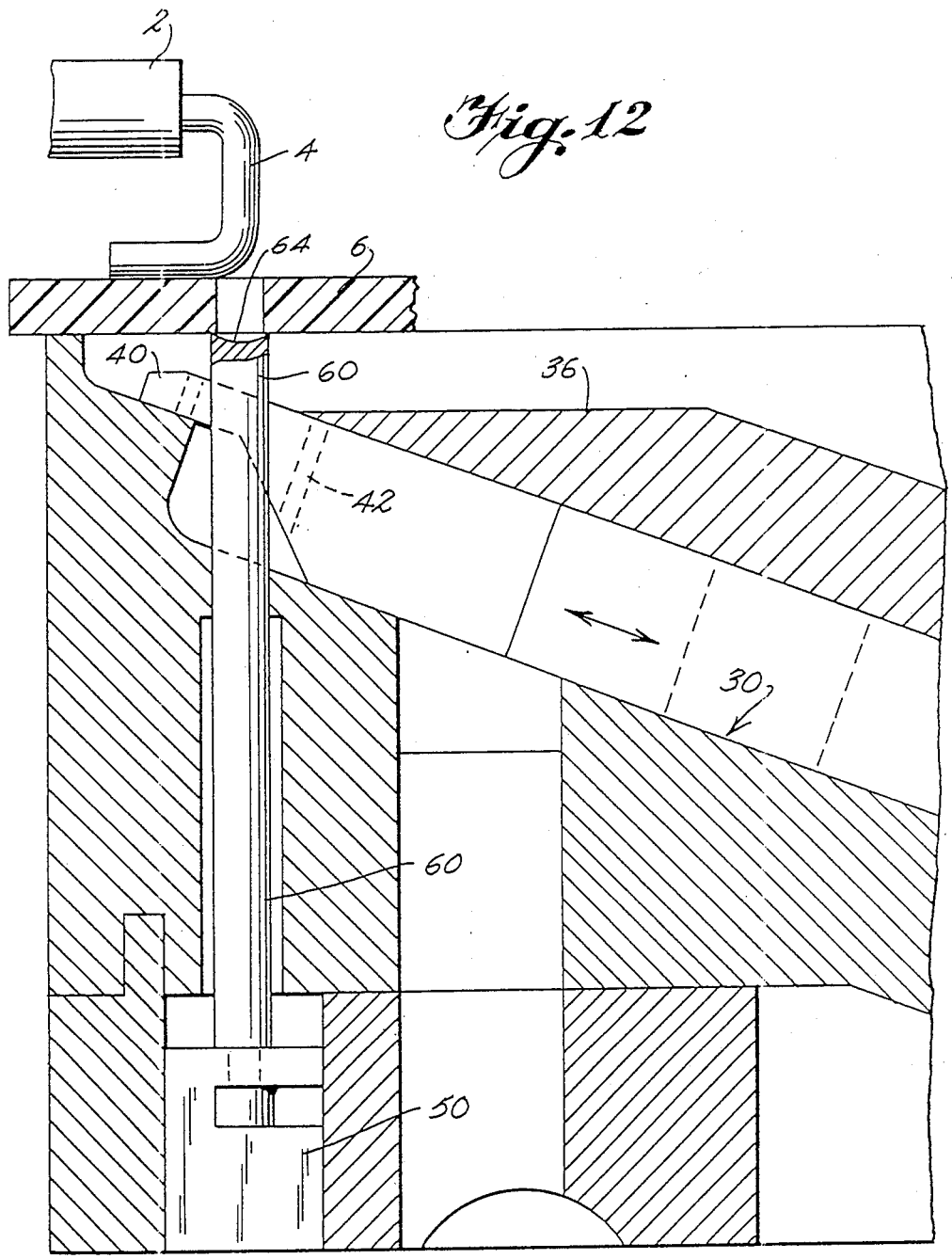

For instance, referring to FIG. 12, the lead 4 of component 2 is bent and does not extend through the hole of the circuit board 6. Thus, pin 60 of the detector mechanism is extended fully to the undersurface of circuit board 6. As seen in FIG. 2, pin 60 is supported by piston 50 which is reciprocatable within cylinder 12 of housing 10 according to application of fluid under pressure to fluid inlets 14 for extension and fluid inlets 34 for retraction. In the fully extended position of FIGS. 2 and 12, the missing or bent lead is detected when the light beam from transmitter 22 is guided and redirected to receiver 20 by means of optic fiber 56 which is mounted in piston 50.

Figure 10:
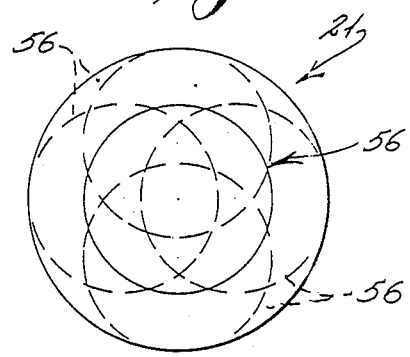
FIG. 10 illustrates the differences in diameter between the optic fiber and the light emitting hole of the transmitter (or the light receiving hole of the receiver) of the sensor unit.

As may be seen by reference to FIG. 10, the diameter of optic fiber 56 is sufficiently smaller than the diameter of receiver hole 21 (which is equal in diameter to transmitter hole 23) so that optic fiber 56 may be displaced relative to receiver hole 21, as illustrated in phantom lines, and still present a full cross sectional face of the fiber for transmission of light to receiver 20 (and from transmitter 22). Thus, the difference between the radius of optic fiber 56 and that of the corresponding hole 21 or 23 provides a tolerance for accommodating vibrations and the like while still transmitting a full compliment of light so as to detect a defective lead.

Figure 11:
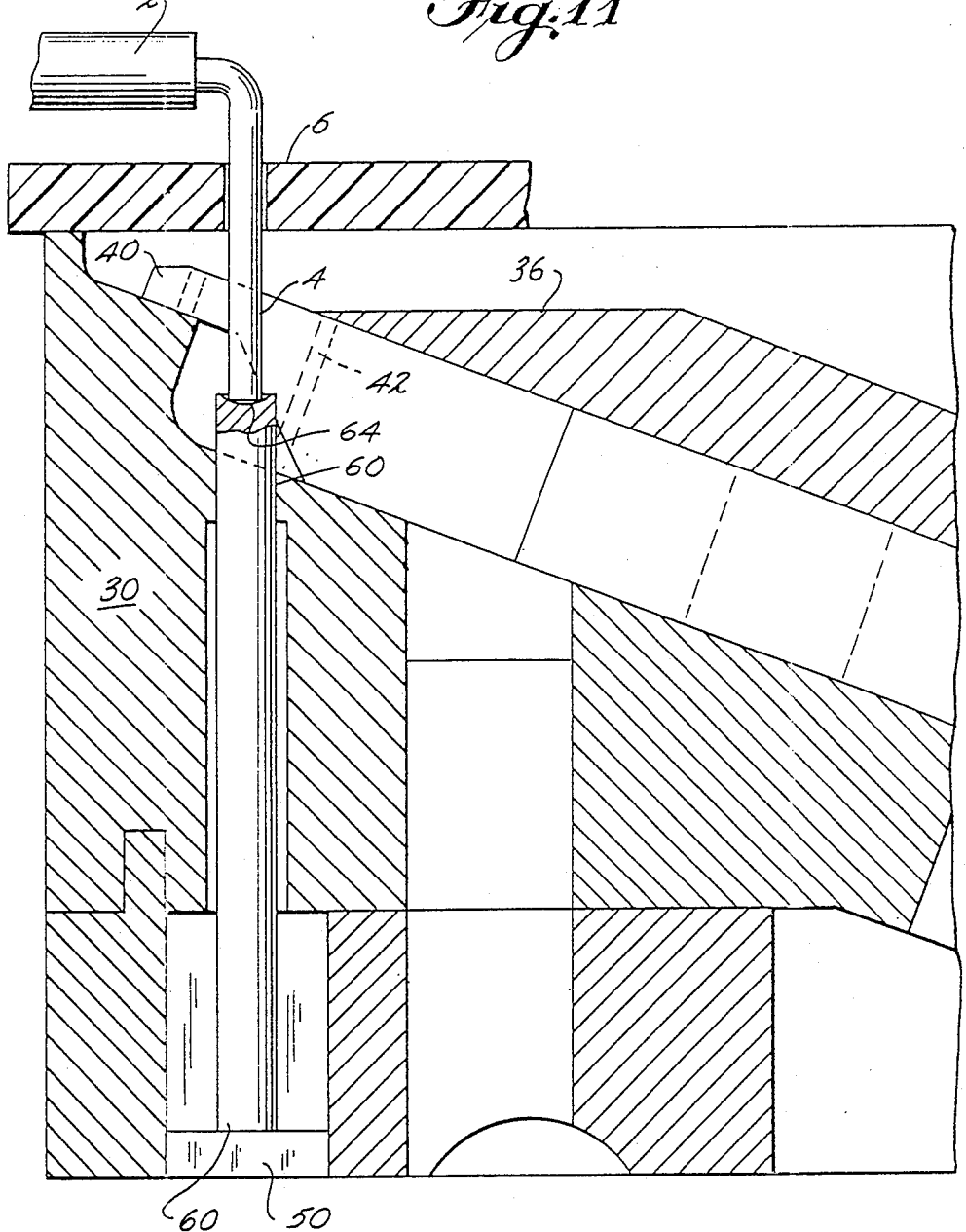
FIGS. 11 and 12, respectively, illustrate use of the device in detecting an acceptable lead and an unacceptable lead.

As seen in FIG. 11, an acceptable lead does not allow full extension of pin 60. In fact, when the lead 4 of component 2 extends sufficiently below the undersurface of circuit board 6, pin 60 is retracted within cylinder 12 sufficiently to prevent transmission of light by optic fiber 56 between transmitter 22 and receiver 20 of sensor package 18.

Referring to FIG. 4, each piston 50 is provided with a slot 52 so as to allow passage of light from a LED 16 (seen in FIGS. 1 and 2) and through the slots 52 of the corresponding pistons to a receiver (not shown) when all leads are acceptable.

Periodically, such as after population of each circuit board, all of the pistons 50 are fired upwardly to fully extend pins 60 so that the optic fiber 56 completes a light path from transmitter 22 to a receiver 20 corresponding to each piston 50. It is not necessary that individual light sources be provided for each piston 50. Rather, one light source can serve all of the pistons in each mirrored half of the device.

Referring to FIGS. 4-8, pins 60 have a reduced portion 62 so as to be slidably receivable within a slot 54 at the upper end of piston 50. Thus, the pins 60 are interchangeable allowing for replacement in case of damage or according to acceptable lead lengths and/or a different height "h" of anvil 30 (as seen in FIGS. 1 and 2), as well as to accommodate various configurations of anvils and cutting blades according to their angle relation with the bottom surface of the circuit board.

As seen in FIG. 3, the force imparted to the end of the lead via pin 60 is regulatable by simply regulating the fluid pressure applied to piston 50. Although the retraction air inlets 34 are illustrated as receiving the regulated pressure in FIG. 3, it is possible in practice to regulate the pressure applied to only inlets 14 for extension of the pistons. However, it is certainly conceivable that the same output from the pressure regulator could be switched from inlets 14 to inlets 34 for purposes of retraction.

Figure 6:
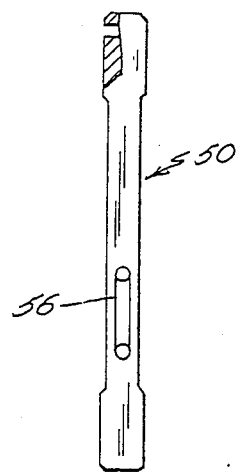
FIGS. 6 and 7, respectively, are left and right side elevations of the device of FIG. 4.
Figure 7:
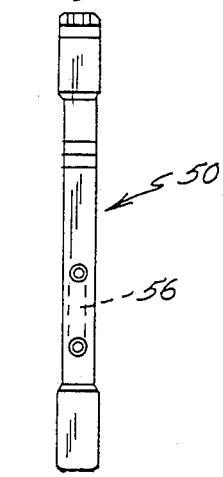
Figure 8:
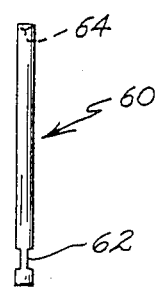
FIG. 8 is an elevation of one of the removable lead contacting pins.
Figure 9:
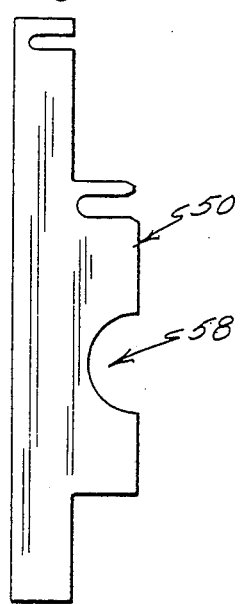
FIG. 9 is a view similar to that of FIG. 4, but illustrating an alternate embodiment of the interposer.

Referring to FIG. 9, an embodiment of piston 50 includes a recessed reflective surface 58 such as a radius formed therein or, alternatively, two angled surfaces within the recess for redirecting and reflecting light. In a prototype of the embodiment of FIG. 9, such guiding and redirection of the light was not as easily and efficiently controllable as by use of the optic fiber of the preferred embodiment.

Typically, the center distances of leads on the same side of a DIP are approximately 0.100 inches, while the center distances between leads on opposite sides of these components range from 0.300 to 0.600 inches. Thus, the instant invention allows and facilitates variable center distance (VCD) adjustment in a device of the type generally indicated in the above-referenced U.S. Pat. No. 4,151,637, With the particular inventive structure of the optic fiber allowing the transmitter and receiver to be placed on the outside of the device such that variable and close center distances are easily accommodated.

As seen in FIG. 12, cutter blade 40 is reciprocatable at an angle and is provided with a hole 42 which allows each corresponding pin 60 to extend therethrough for the purpose of lead detection. After such detection of the leads has been accomplished, reciprocating blade 40 may be retracted to draw the lead across the edge of blade 36 so as to outwardly clinch the lead during trimming thereof. Inward clinching of the lead may also be accomplished by the invention although pin 60 would need to be retracted further than illustrated in FIG. 11. With such an arrangement, after detection of the leads and retraction of pins 60, reciprocatable blade 40 is extended to inwardly clinch the lead during trimming thereof.

In a prototype, the various timing and functioning of the overall device, was Motorola MC68008P8 microprocessor chip.

In use of the invention, it is preferred that the leads are already fully extended through the holes of the circuit board prior to extension of pin 60 into engagement therewith, since it has been found that fragile leads withstand this engagement pressure without bending much better than the situation where pins 60 are fully extended prior to insertion of the leads through the holes and into contact with pins 60. Particularly significant in this regard is the variability of the engagement pressure according to variation of the fluid pressure applied, as provided by tee invention.

Thus, it may be seen that the objects set forth above, among those made apparent from the preceding description, are efficiently attained and, since certain changes may be made in the construction set forth without departing from the scope of the invention, it is intended that all matter contained in the above description or shown in the accompanying drawings shall be interpreted as illustrative and not in a limiting sense. For instance, it is contemplated that the sensor package and optic fibers may be arranged so as to complete the light path upon sufficient retraction of the piston in response to an acceptable lead. It is also contemplated that two optic fibers could be utilized in each piston with a transmitting and receiving system so that acceptable and unacceptable leads could be detected in the same manner.

It is also to be understood that the following claims are intended to cover all of the generic and specific features of the invention herein described and also statements of the scope of the invention which, as a matter of language, might be said to fall there between.

We claim:

1. In a method of differentiating between sufficient and insufficient protrusion of component leads from a substrate by means of interposers individually engageable with corresponding protruding leads, and comprising the steps of displacing each of said interposers according to engagement with a corresponding lead, operating upon at least one light beam in response to said displacing, and performing said differentiating according to said operating, the improvement comprising the steps of:

applying a pressure to said interposers; and adjustably varying said pressure applied to said interposers in order to adjustably vary a force of engagement between said leads and interposers.

2. The improvement of claim 1, and further comprising the step of:

applying pressure simultaneously and directly to each of said interposers via a plenum common to all of said interposers.

3. The improvement of claim 1, and further comprising the step of:

providing said pressure to said interposers via fluid.

4. The improvement as in claim 3, and further comprising the step of:

providing and utilizing a pressure regulator for said fluid in order to accomplish said varying adjustably.

5. In a method of differentiating between sufficient and insufficient protrusion of component leads from a substrate, by means of interposers individually engageable with corresponding protruding leads, and comprising the steps of displacing each of said interposers according to engagement with a corresponding lead, operating upon at least one light beam in response to said displacing, and performing said differentiating according to said operating, the improvement comprising the steps of:

providing optic fiber in each said interposer; and passing said light beam through said fiber and detecting passage of said light beam therethrough in response to a condition of said differentiating.

6. The improvement as in claim 5, and further comprising the steps of:

forming at least one bend in said fiber; and redirecting and guiding said light beam via said fiber from a light transmitter to a light receiver.

7. In a method of differentiating between sufficient and insufficient protrusion of component leads from a substrate, by means of interposers individually engageable with corresponding protruding leads, and comprising the steps of displacing each of said interposers according to engagement with a corresponding lead, operating upon at least one light beam in response to said displacing, and performing said differentiating according to said operating, the improvement comprising the steps of:

providing a specific reflective structure as part of each said interposer; and detecting passage of said light beam via said reflective structure in response to a condition of said differentiating.

8. In a method of differentiating between sufficient and insufficient protrusion of component leads from a substrate, by means of interposers individually engageable with corresponding protruding leads, and comprising the steps of displacing each of said interposers according to engagement with a corresponding lead, operating upon at least one light beam in response to said displacing, and performing said differentiating according to said operating, the improvement comprising the steps of:

providing interchangeable lead engaging portions for each interposer; and replacing a lead engaging portion of each interposer according to different requirements of said differentiating.

9. In an apparatus for differentiating between sufficient and insufficient protrusion of component leads from a substrate by means of interposers individually engageable with corresponding protruding leads and having means for displacing each of said interposers according to engagement with a corresponding lead, means for operating upon at least one light beam in response to said displacing, and means for performing said differentiating according to said operating, the improvement comprising:

means for applying a pressure to said interposers; and means for adjustably varying a pressure applied to said interposers in order to adjustably vary a force of engagement between said leads and interposers.

10. The improvement of claim 9, and further comprising;

a plenum commonly receiving all of said interposers moveably therein; and means for applying fluid pressure simultaneously and directly to each of said interposers via said plenum.

11. The improvement as in claim 10, and further comprising:

a pressure regulator means for adjusting said fluid pressure.

12. In an apparatus for differentiating between sufficient and insufficient protrusion of component leads from a substrate, by means of interposers individually engageable with corresponding protruding leads, and comprising means for displacing each of said interposers according to engagement with a corresponding lead, means for operating upon at least one light beam in response to said displacing, and means for performing said differentiating according to said operating, the improvement comprising:

optic fiber in each said interposer; and means for detecting passage of said light beam through said fiber, in response to a condition of said differentiating.

13. In an apparatus for differentiating between sufficient and insufficient protrusion of component leads from a substrate by means of interposers individually engageable with corresponding protruding leads and having means for displacing each of said interposers according to engagement with a corresponding lead, means for operating upon at least one light beam in response to said displacing, and means for performing said differentiating according to said operating, the improvement comprising:

a specific reflective structure as part of each said interposer; and means for detecting passage of said light beam via said reflective structure in response to a condition of said differentiating.

14. In an apparatus for differentiating between sufficient and insufficient protrusion of component leads from a substrate by means of interposers individually engageable with corresponding protruding leads and having means for displacing each of said interposers according to engagement with a corresponding lead, means for operating upon at least one light beam in response to said displacing, and means for performing said differentiating according to said operating, the improvement comprising:

an interchangeable lead engaging portion for each said interposer.

* * * * *